United States Patent
Hiyoshi et al.

(10) Patent No.: US 9,362,121 B2
(45) Date of Patent: Jun. 7, 2016

(54) METHOD OF MANUFACTURING A SILICON CARBIDE SEMICONDUCTOR DEVICE

(71) Applicant: Sumitomo Electric Industries, Ltd., Osaka-shi (JP)

(72) Inventors: Toru Hiyoshi, Osaka (JP); Yu Saitoh, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/439,164

(22) PCT Filed: Oct. 8, 2013

(86) PCT No.: PCT/JP2013/077326
§ 371 (c)(1),
(2) Date: Apr. 28, 2015

(87) PCT Pub. No.: WO2014/083943
PCT Pub. Date: Jun. 5, 2014

(65) Prior Publication Data
US 2015/0311076 A1    Oct. 29, 2015

(30) Foreign Application Priority Data

Nov. 28, 2012    (JP) ................................. 2012-259551

(51) Int. Cl.
*H01L 31/0312* (2006.01)
*H01L 21/04* (2006.01)
(Continued)

(52) U.S. Cl.
CPC ........ *H01L 21/049* (2013.01); *H01L 21/02164* (2013.01); *H01L 21/02236* (2013.01);
(Continued)

(58) Field of Classification Search
CPC ............ H01L 31/0312; H01L 29/1608; H01L 29/1602; H01L 29/7802
USPC ......................................................... 257/77
See application file for complete search history.

(56) References Cited

U.S. PATENT DOCUMENTS 4,217,149 A * 8/1980 Sawazaki ........ H01L 21/823807
257/376
5,703,390 A * 12/1997 Itoh ....................... H01L 27/088
257/337

(Continued)

FOREIGN PATENT DOCUMENTS

| JP | 2009-224365 A | 10/2009 |
| JP | 2012-164788 A | 8/2012 |
| WO | WO-2012/098861 A1 | 7/2012 |

OTHER PUBLICATIONS

Brett A. Hull et al., "Performance of 60A, 1200V 4H-SiC DMOSFETs,"; Materials Science Forum, vols. 615-617, 2009, pp. 749-752.

(Continued)

*Primary Examiner* — Phuc Dang
(74) *Attorney, Agent, or Firm* — Venable LLP; Michael A. Sartori; Trent B. Ostler

(57) ABSTRACT

A silicon carbide substrate including a first impurity region, a well region, and a second impurity region separated from the first impurity region by the well region is prepared. A silicon dioxide layer is formed in contact with the first impurity region and the well region. A gate electrode is formed on the silicon dioxide layer. A silicon-containing material is formed on the first impurity region. The silicon-containing material is oxidized. The silicon dioxide layer includes a first silicon dioxide region on the first impurity region and a second silicon dioxide region on the well region. The thickness of the first silicon dioxide region is greater than the thickness of the second silicon dioxide region. Consequently, a silicon carbide semiconductor device capable of achieving improved switching characteristics while suppressing a decrease in drain current, and a method of manufacturing the same can be provided.

7 Claims, 6 Drawing Sheets

(51) Int. Cl.
| | |
|---|---|
| *H01L 29/66* | (2006.01) |
| *H01L 29/739* | (2006.01) |
| *H01L 29/16* | (2006.01) |
| *H01L 29/423* | (2006.01) |
| *H01L 29/78* | (2006.01) |
| *H01L 29/12* | (2006.01) |
| *H01L 21/02* | (2006.01) |

(52) U.S. Cl.
CPC ............ *H01L29/12* (2013.01); *H01L 29/1608* (2013.01); *H01L 29/42368* (2013.01); *H01L 29/66068* (2013.01); *H01L 29/66712* (2013.01); *H01L 29/7395* (2013.01); *H01L 29/78* (2013.01); *H01L 29/7802* (2013.01)

(56) References Cited

U.S. PATENT DOCUMENTS

2004/0104429 A1* 6/2004 Takahashi ........... H01L 29/0623
　　　　　　　　　　　　　　　　　　　　　　　　257/338
2012/0056271 A1* 3/2012 Akamatsu ......... H01L 21/76224
　　　　　　　　　　　　　　　　　　　　　　　　257/392
2012/0199846 A1    8/2012 Shimizu et al.

OTHER PUBLICATIONS

International Search Report issued in PCT International Application No. PCT/JP2013/077326 dated Jan. 14, 2014.

* cited by examiner

METHOD OF MANUFACTURING A SILICON CARBIDE SEMICONDUCTOR DEVICE

TECHNICAL FIELD

The present invention relates to silicon carbide semiconductor devices and methods of manufacturing the same, and more particularly to a silicon carbide semiconductor device capable of achieving improved switching characteristics and a method of manufacturing the same.

BACKGROUND ART

In recent years, silicon carbide has been increasingly employed as a material for a semiconductor device such as a MOSFET (Metal Oxide Semiconductor Field Effect Transistor) in order to allow a higher breakdown voltage, lower loss and the use in a high-temperature environment and the like of the semiconductor device. Silicon carbide is a wide band gap semiconductor having a band gap wider than that of silicon which has been conventionally and widely used as a material for a semiconductor device. By employing the silicon carbide as a material for a semiconductor device, therefore, a higher breakdown voltage, lower on-resistance and the like of the semiconductor device can be achieved. A semiconductor device made of silicon carbide also has the advantage of exhibiting less performance degradation when used in a high-temperature environment than a semiconductor device made of silicon.

For example, Brett A. Hull et al., "Performance of 60 A, 1200V 4H—SiC DMOSFETs", Materials Science Forum, Vols. 615-617, 2009, pp 749-752 (NPD 1) discloses a MOSFET including an n type drift layer formed on a silicon carbide substrate, a pair of well regions, and a gate insulating film. According to the MOSFET disclosed in this document, switching energy loss is 9 mJ at the time of switching from an on state where a drain-source current is 65 A to an off state where a drain-source voltage is 750 V.

CITATION LIST

Non Patent Document

NPD 1: Brett A. Hull et al., "Performance of 60 A, 1200V 4H—SiC DMOSFETs", Materials Science Forum, Vols. 615-617, 2009, pp 749-752

SUMMARY OF INVENTION

Technical Problem

In order to improve switching characteristics, the capacitance of a silicon carbide semiconductor device needs to be reduced. The capacitance is inversely proportional to the thickness of an insulator sandwiched between electrodes. Thus, the capacitance can be reduced by increasing the thickness of a gate insulating film. However, the increased thickness of the gate insulating film causes a decrease in drain current flowing through a channel.

The present invention has been made to solve such a problem, and an object of the present invention is to provide a silicon carbide semiconductor device capable of achieving improved switching characteristics while suppressing a decrease in drain current, and a method of manufacturing the same.

Solution to Problem

The present inventors conducted a detailed study and arrived at the present invention based on the following findings. First, it is effective to reduce the capacitance of a device in order to improve switching characteristics. It is desirable to reduce the capacitance of a device, particularly the capacitance (reverse transfer capacitance) of a portion where a JFET (Junction Field Effect Transistor) region sandwiched between a pair of well regions and a gate electrode face each other with a gate insulating film interposed therebetween.

In order to reduce the capacitance between the JFET region and the gate electrode, it is effective to increase the thickness of the gate insulating film on the JFET region. However, the increased thickness of the entire gate insulating film causes a decrease in value of a drain current flowing through a channel. It is thus desirable to increase the thickness of the gate insulating film on the JFET region while maintaining a small thickness of the gate insulating film on the well regions.

The present inventors found that, by forming a silicon-containing material on the JFET region and oxidizing the silicon-containing material, the thickness of the gate insulating film on the JFET region can be increased while a small thickness of the gate insulating film on the well regions is maintained. A silicon-containing material such as polysilicon is more readily oxidized than silicon carbide. Thus, by forming a silicon-containing material on the JFET region and oxidizing the silicon-containing material, and oxidizing the surfaces of the well regions made of silicon carbide, the thickness of the gate insulating film on the JFET region can be made greater than the thickness of the gate insulating film on the well regions.

Accordingly, a method of manufacturing a silicon carbide semiconductor device according to the present invention includes the following steps. A silicon carbide substrate including a first impurity region having a first conductivity type, a well region being in contact with the first impurity region and having a second conductivity type different from the first conductivity type, and a second impurity region separated from the first impurity region by the well region and having the first conductivity type is prepared. A silicon dioxide layer in contact with the first impurity region and the well region is formed. A gate electrode is formed on the silicon dioxide layer. The step of forming a silicon dioxide layer includes the following steps. A silicon-containing-material is formed on the first impurity region. The silicon-containing-material is oxidized. A surface of the well region sandwiched between the first impurity region and the second impurity region is oxidized. The silicon dioxide layer includes a first silicon dioxide region on the first impurity region, and a second silicon dioxide region on the well region sandwiched between the first impurity region and the second impurity region. Assuming that the thickness of the first silicon dioxide region is a first thickness and the thickness of the second silicon dioxide region is a second thickness, the first thickness is greater than the second thickness. In the present invention, forming the silicon-containing-material on the first impurity region includes forming the silicon-containing-material on the first impurity region with a layer such as a silicon dioxide layer interposed therebetween.

According to the method of manufacturing a silicon carbide semiconductor device of the present invention, the thickness of the first silicon dioxide region is greater than the thickness of the second silicon dioxide region. Accordingly, the capacitance of the silicon carbide semiconductor device can be reduced while a decrease in drain current is suppressed. As a result, the switching characteristics of the silicon carbide semiconductor device can be improved while a decrease in drain current is suppressed.

Preferably, in the method of manufacturing a silicon carbide semiconductor device, the silicon-containing-material includes one of polysilicon, amorphous silicon, and amorphous silicon carbide. Consequently, the thickness of the first silicon dioxide region can be efficiently made greater than the thickness of the second silicon dioxide region.

Preferably, in the method of manufacturing a silicon carbide semiconductor device, the width of the silicon-containing-material is smaller than the width of the first impurity region. Consequently, even if the silicon-containing material expands in a width direction, the thickness of the first silicon dioxide region can be made greater than the thickness of the second silicon dioxide region.

Preferably, in the method of manufacturing a silicon carbide semiconductor device, a carbon concentration in the first silicon dioxide region is lower than a carbon concentration in the second silicon dioxide region. Consequently, the insulation performance of the first silicon dioxide region can be improved to thereby improve the breakdown voltage at the time of application of a reverse voltage.

Preferably, in the method of manufacturing a silicon carbide semiconductor device, the first thickness is 1.5 times or more and 5 times or less the second thickness. When the first thickness is 1.5 times or more the second thickness, the carbon concentration in the first silicon dioxide region can be efficiently made lower than the carbon concentration in the second silicon dioxide region. When the first thickness is 5 times or less the second thickness, on the other hand, a level difference between the gate electrode formed on the second silicon dioxide region and the gate electrode formed on the first silicon dioxide region does not become too great, thus allowing the gate electrode to be formed without being isolated.

Preferably, in the method of manufacturing a silicon carbide semiconductor device, in the step of forming a silicon dioxide layer, the step of oxidizing the silicon-containing-material and the step of oxidizing a surface of the well region are simultaneously performed. Consequently, the first thickness can be efficiently made greater than the second thickness.

Preferably, in the method of manufacturing a silicon carbide semiconductor device, in the step of forming a silicon dioxide layer, the step of forming a silicon-containing-material is performed after the step of oxidizing a surface of the well region. Consequently, an oxidation temperature for the surface of the well region and an oxidation temperature for the silicon-containing material can be independently adjusted.

Preferably, in the method of manufacturing a silicon carbide semiconductor device, a temperature in the step of oxidizing the silicon-containing-material is lower than a temperature in the step of oxidizing a surface of the well region. Consequently, the silicon-containing material can be oxidized without being melted.

A silicon carbide semiconductor device according to the present invention includes a silicon carbide substrate, a first silicon dioxide region, a second silicon dioxide region, and a gate electrode. The silicon carbide substrate includes a first impurity region having a first conductivity type, a well region being in contact with the first impurity region and having a second conductivity type different from the first conductivity type, and a second impurity region separated from the first impurity region by the well region and having the first conductivity type. The first silicon dioxide region is arranged on the first impurity region. The second silicon dioxide region is arranged on a surface of the well region sandwiched between the first impurity region and the second impurity region. The gate electrode is arranged on the first silicon dioxide region and the second silicon dioxide region. The thickness of the first silicon dioxide region is greater than the thickness of the second silicon dioxide region. A carbon concentration in the first silicon dioxide region is lower than a carbon concentration in the second silicon dioxide region.

According to the silicon carbide semiconductor device of the present invention, the thickness of the first silicon dioxide region is greater than the thickness of the second silicon dioxide region. Accordingly, the capacitance of the silicon carbide semiconductor device can be reduced while a decrease in drain current is suppressed. As a result, the switching characteristics of the silicon carbide semiconductor device can be improved while a decrease in drain current is suppressed.

Preferably, in the silicon carbide semiconductor device, the thickness of the first silicon dioxide region is 1.5 times or more and 5 times or less the thickness of the second silicon dioxide region. When the first thickness is 1.5 times or more the second thickness, the carbon concentration in the first silicon dioxide region can be efficiently made lower than the carbon concentration in the second silicon dioxide region. When the first thickness is 5 times or less the second thickness, on the other hand, a level difference between the gate electrode formed on the second silicon dioxide region and the gate electrode formed on the first silicon dioxide region does not become too great, thus allowing the gate electrode to be formed without being isolated.

Advantageous Effects of Invention

As is evident from the description above, according to the present invention, a silicon carbide semiconductor device capable of achieving improved switching characteristics while suppressing a decrease in drain current, and a method of manufacturing the same can be provided.

DESCRIPTION OF EMBODIMENTS

Embodiments of the present invention will be described below with reference to the drawings. In the following drawings, the same or corresponding parts have the same reference numbers allotted and description thereof will not be repeated. Regarding crystallographic denotation herein, an individual orientation, a group orientation, an individual plane, and a group plane are shown in [ ], < >, ( ) and { }, respectively. Although a crystallographically negative index is normally expressed by a number with a bar "-" thereabove, a negative sign herein precedes a number to indicate a crystallographically negative index. In addition, angles are described using a system having an omnidirectional angle of 360 degrees.

(First Embodiment)

Figure 1:
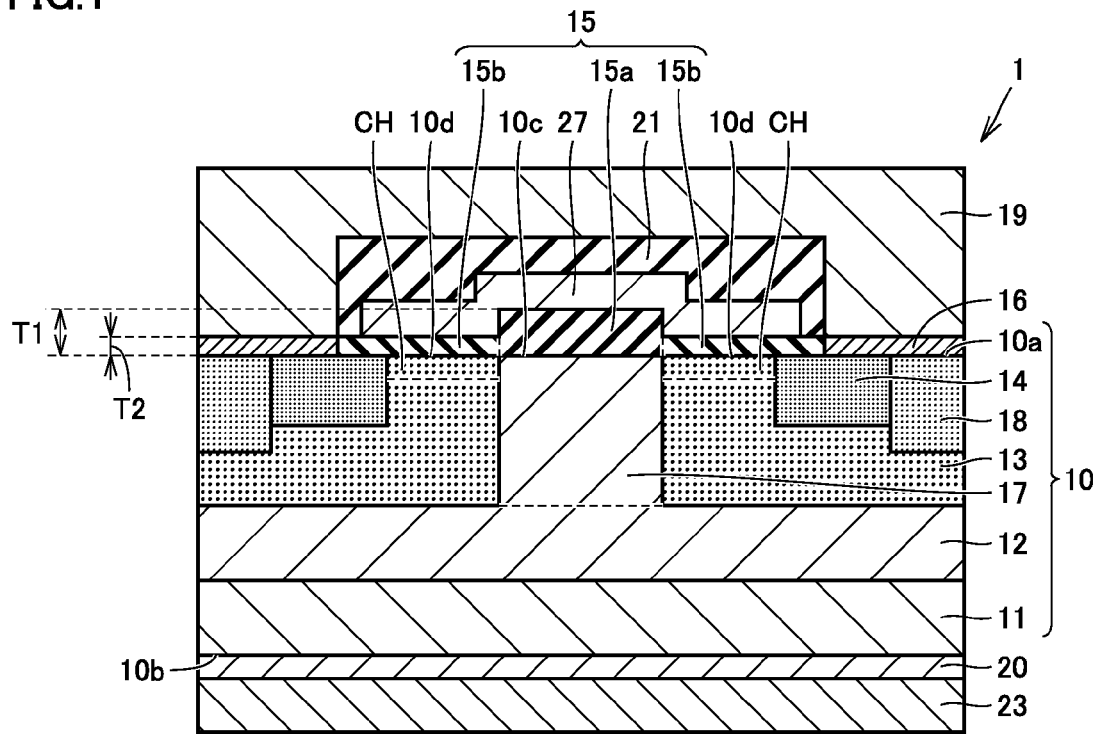
FIG. 1 is a schematic sectional view schematically showing the structure of a silicon carbide semiconductor device according to a first embodiment of the present invention.

Referring to FIG. 1, a MOSFET 1 which is a silicon carbide semiconductor device in a first embodiment mainly includes a silicon carbide substrate 10, a gate insulating film 15, a gate electrode 27, a source contact electrode 16, and a drain electrode 20.

Silicon carbide substrate 10 is made of hexagonal silicon carbide of polytype 4H, for example. A main surface 10a of silicon carbide substrate 10 may be angled off at approximately not more than 8° relative to a (0001) plane, for example, and may be a (0-33-8) plane. Preferably, main surface 10a is a plane macroscopically having an off angle of 62°±10° relative to a {000-1} plane.

Silicon carbide substrate 10 mainly includes a base substrate 11, a drift layer 12, a well region 13, a second impurity region 14, and a p+ region 18. The base substrate is an epitaxial layer made of silicon carbide and having n type conductivity (first conductivity type). Drift layer 12 is arranged on base substrate 11, and has n type conductivity. Drift layer 12 contains an impurity such as nitrogen (N). A nitrogen concentration in drift layer 12 is approximately $5\times10^{15}$ cm$^{-3}$, for example. Drift layer 12 includes a first impurity region 17. First impurity region 17 is a JFET region which is part of drift layer 12 and which is sandwiched between a pair of well regions 13 that will be described later. Drift layer 12 and first impurity region 17 have the same conductivity type.

Well region 13 is in contact with first impurity region 17, and has p type conductivity (second conductivity type) different from the n type conductivity (first conductivity type). The pair of well regions 13 is arranged so as to sandwich first impurity region 17 therebetween, and contains an impurity such as aluminum (Al) or boron (B). An aluminum or boron concentration in well region 13 is approximately $1\times10^{17}$ cm$^{-3}$, for example.

Second impurity region 14 is separated from first impurity region 17 by well region 13. Second impurity region 14 is an n+ region having n type conductivity (first conductivity type). Second impurity region 14 is formed within each of the pair of well regions 13 so as to include main surface 10a and be surrounded by well region 13. Second impurity region 14 contains an impurity such as phosphorus (P) in higher concentration (density) than that of the impurity contained in drift layer 12. The phosphorus concentration in second impurity region 14 is approximately $1\times10^{20}$ cm$^{-3}$, for example.

P+ region 18 is formed within each of the pair of well regions 13 so as to include main surface 10a, be surrounded by well region 13, and be adjacent to second impurity region 14. P+ region 18 is arranged in contact with source contact electrode 16, second impurity region 14 and well region 13. P+ region 18 contains an impurity such as Al in higher concentration (density) than that of the impurity contained in well region 13. The Al concentration in p+ region 18 is approximately $1\times10^{20}$ cm$^{-3}$, for example.

Gate insulating film 15 is made of silicon dioxide, and arranged in contact with main surface 10a of silicon carbide substrate 10. Main surface 10a of silicon carbide substrate 10 includes a surface 10c of first impurity region 17, and a surface 10d of well region 13 sandwiched between first impurity region 17 and second impurity region 14. Gate insulating film 15 includes a first silicon dioxide region 15a arranged in contact with surface 10c of first impurity region 17, and a second silicon dioxide region 15b arranged in contact with surface 10d of well region 13.

A thickness T1 of first silicon dioxide region 15a is greater than a thickness T2 of second silicon dioxide region 15b. Thickness T1 of first silicon dioxide region 15a on first impurity region 17 is approximately 180 nm, for example, and thickness T2 of second silicon dioxide region 15b on well region 13 is approximately 50 nm, for example. Preferably, thickness T1 of first silicon dioxide region 15a is 1.5 times or more and 5 times or less thickness T2 of second silicon dioxide region 15b.

In MOSFET 1 of this embodiment, a channel region CH can be formed in a position facing second silicon dioxide region 15b within well region 17 sandwiched between first impurity region 17 and second impurity region 14. In other words, second silicon dioxide region 15b is arranged on and in contact with channel region CH.

A carbon concentration in first silicon dioxide region 15a is lower than a carbon concentration in second silicon dioxide region 15b. The carbon concentration in first silicon dioxide region 15a is approximately not less than $1\times10^{17}$ cm$^{-3}$ and approximately not more than $1\times10^{19}$ cm$^{-3}$, for example, and the carbon concentration in second silicon dioxide region 15b is approximately not less than $1\times10^{18}$ cm$^{-3}$ and approximately not more than $1\times10^{20}$ cm$^{-3}$, for example. The carbon concentrations in first silicon dioxide region 15a and second silicon dioxide region 15b can be measured by SIMS (Secondary Ion Mass Spectrometry), for example.

Gate electrode 27 is arranged in contact with gate insulating film 15 so as to extend from one of second impurity regions 14 to the other second impurity region 14. Gate electrode 27 is arranged in contact with gate insulating film 15 so as to sandwich gate insulating film 15 between silicon carbide substrate 10 and gate electrode 27. In addition, gate electrode 27 is formed of a conductor such as polysilicon doped with an impurity or Al (aluminum).

Source contact electrode 16 is arranged in contact with second impurity region 14, p+ region 18, and second silicon dioxide region 15b. Source contact electrode 16 is made of a material capable of making ohmic contact with second impurity region 14, such as NiSi (nickel silicide).

Drain electrode 20 is formed in contact with a second main surface 10b of silicon carbide substrate 10 opposite to the side where drift layer 12 is formed. This drain electrode 20 is made of a material capable of making ohmic contact with n type base substrate 11, such as NiSi, and is electrically connected to base substrate 11. A pad electrode 23 is arranged in contact with drain electrode 20. Source contact electrode 16 and drain electrode 20 are configured such that a current flowing between source contact electrode 16 and drain electrode 20 can be controlled by gate electrode 27 applied to gate electrode 27.

Interlayer insulating film 21 is formed so as to be in contact with second silicon dioxide region 15b and surround gate electrode 27. Interlayer insulating film 21 is made of silicon dioxide which is an insulator, for example. A source wire 19 surrounds interlayer insulating film 21 and extends to an upper surface of source contact electrode 16 on main surface 10a of silicon carbide substrate 10. Source wire 19 is formed of a conductor such as Al, and is electrically connected to second impurity region 14 via source contact electrode 16.

The operation of MOSFET 1 is now described. Referring to FIG. 1, when a voltage of gate electrode 27 is lower than a threshold voltage, namely, in an off state, a pn junction between well region 13 located immediately below gate insulating film 15 and first impurity region 17 is reverse biased, resulting in a non-conducting state. When a voltage equal to or higher than the threshold voltage is applied to gate electrode 27, on the other hand, an inversion layer is formed in channel region CH near an area where well region 13 and gate insulating film 15 are in contact with each other. As a result, second impurity region 14 and first impurity region 17 are electrically connected together, causing a current to flow between source wire 19 and drain electrode 20.

An example of a method of manufacturing MOSFET 1 in this embodiment is now described with reference to FIGS. 2 to 7.

Figure 2:
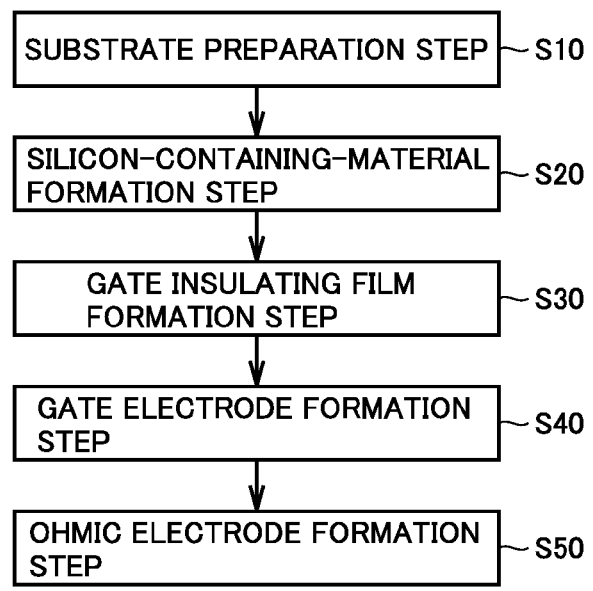
FIG. 2 is a flow diagram schematically showing a method of manufacturing the silicon carbide semiconductor device according to the first embodiment of the present invention.
Figure 3:
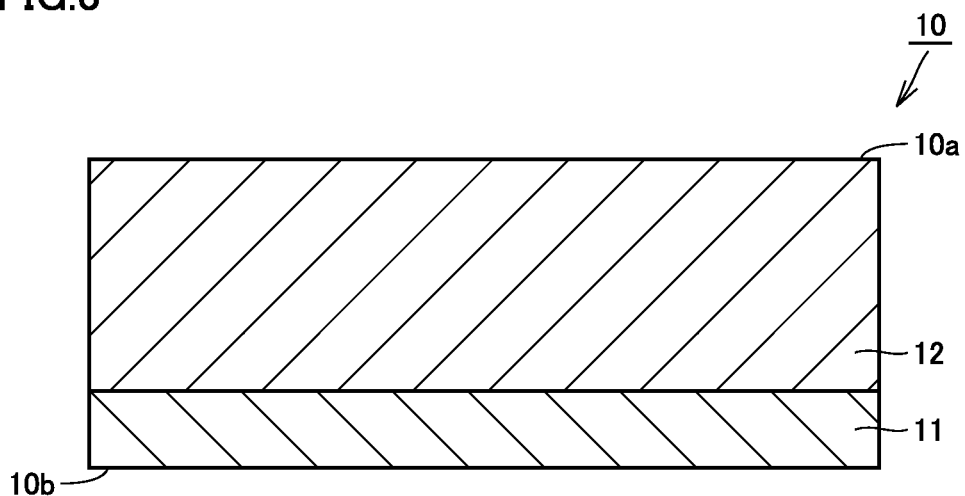
FIG. 3 is a schematic sectional view schematically showing a first step of the method of manufacturing the silicon carbide semiconductor device according to the first embodiment of the present invention.
Figure 4:
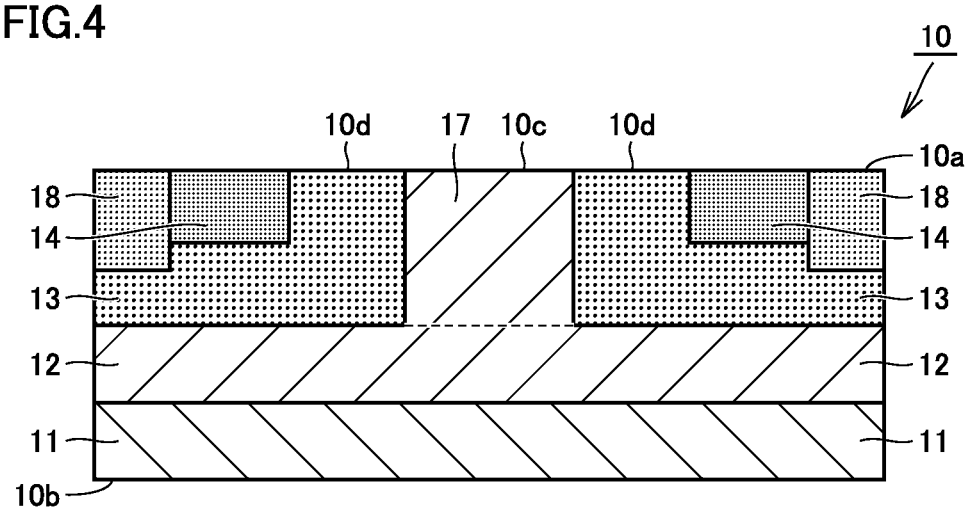
FIG. 4 is a schematic sectional view schematically showing a second step of the method of manufacturing the silicon carbide semiconductor device according to the first embodiment of the present invention.
Figure 5:
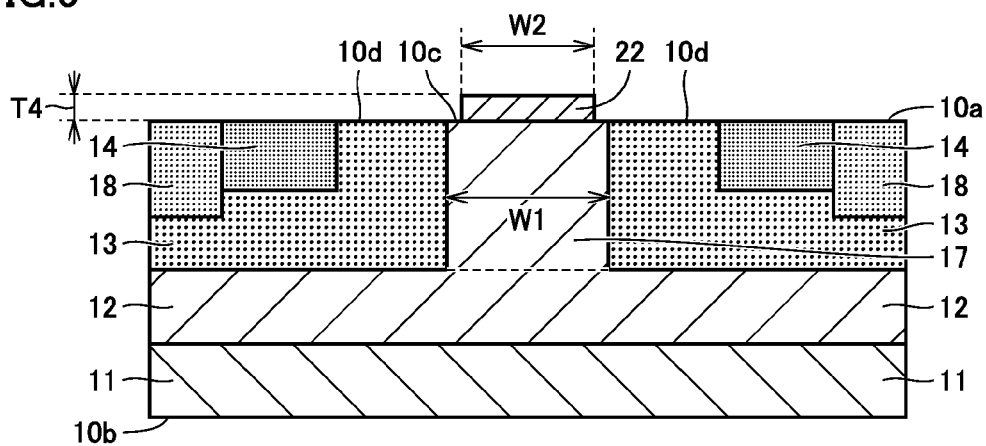
FIG. 5 is a schematic sectional view schematically showing a third step of the method of manufacturing the silicon carbide semiconductor device according to the first embodiment of the present invention.

First, a substrate preparation step (S10: FIG. 2) is performed. Specifically, referring to FIG. 3, base substrate 11 made of hexagonal silicon carbide of polytype 4H, for example, is prepared, and drift layer 12 having n type conductivity (first conductivity type) is formed on base substrate 11 by epitaxial growth. Drift layer 12 contains an impurity such as N (nitrogen) ions. Silicon carbide substrate 10 having main surface 10a and including drift layer 12 of the first conductivity type is thus prepared. Main surface 10a of silicon carbide substrate 10 may be angled off at approximately 8° relative to the (0001) plane, for example, and may be the (0-33-8) plane. Preferably, main surface 10a is a plane macroscopically having an off angle of 62°±10° relative to the {000-1} plane.

Next, a well region formation step is performed. Specifically, referring to FIG. 4, well region 13 is formed by implanting Al (aluminum) ions, for example, into drift layer 12. Then, ion implantation for forming second impurity region 14 is performed. Specifically, second impurity region 14 is formed within well region 13 by implanting P (phosphorous) ions, for example, into well region 13. Furthermore, ion implantation for forming p+ region 18 is performed. Specifically, p+ region 18 is formed in contact with second impurity region 14 within well region 13 by implanting Al ions, for example, into well region 13. The aforementioned ion implantations can be performed by forming a mask layer, which is made of silicon dioxide and provided with openings in desired regions where the ion implantations are to be performed, on main surface 10a of drift layer 12, for example.

As described above, silicon carbide substrate 10 including first impurity region 17 having n type conductivity, well region 13 being in contact with first impurity region 17 and having p type conductivity different from the n type conductivity, and second impurity region 14 separated from first impurity region 17 by well region 13 and having n type conductivity (see FIG. 4) is prepared.

Next, an activation annealing step is performed. Specifically, heat treatment is conducted in which silicon carbide substrate 10 is heated to approximately 1700° C., for example, and held for approximately 30 minutes in an inert gas atmosphere such as argon. This activates the implanted impurities.

Next, a step of forming a silicon dioxide layer is performed. The step of forming a silicon dioxide layer includes a step of forming a silicon-containing material 22 on first impurity region 17, a step of oxidizing the silicon-containing material, and a step of oxidizing surface 10d of well region 13 sandwiched between first impurity region 17 and second impurity region 14.

In this embodiment, first, a silicon-containing-material formation step (S20: FIG. 2) is performed. Specifically, referring to FIG. 5, silicon-containing material 22 is formed on surface 10c of first impurity region 17 sandwiched between the pair of well regions 13. Silicon-containing material 22 is, for example, polysilicon, amorphous silicon, amorphous silicon carbide and the like, and may be single-crystal silicon. Preferably, silicon-containing material 22 is a material mainly composed of silicon. More preferably, silicon-containing material 22 is a material more readily oxidized than silicon carbide. A thickness T4 of silicon-containing material 22 is approximately 60 nm, for example. First impurity region 17 is a JFET region.

In the step of forming the silicon-containing material, silicon-containing material 22 is preferably formed so as to remain only on surface 10c of silicon carbide substrate 10 in contact with first impurity region 17, by depositing polysilicon on main surface 10a of silicon carbide substrate 10 and then patterning it by wet etching or dry etching, for example. More strictly speaking, silicon-containing material 22 is formed on surface 10c of first impurity region 17 such that the silicon-containing material remains more on surface 10d of well region 13 than on surface 10c of first impurity region 17.

Preferably, a width W2 of the silicon-containing material formed on surface 10c of first impurity region 17 (the distance in a direction parallel to surface 10c) is smaller than a width W1 of the first impurity region (namely, the shortest distance between the pair of well regions 13). Width W1 of the first impurity region is not less than approximately 2.5 μm and not more than approximately 3.0 μm, for example.

Next, a gate insulating film formation step (S30: FIG. 2) is performed. Specifically, silicon-containing material 22 formed on surface 10c of first impurity region 17 of silicon carbide substrate 10, and surface 10d of well region 13 sandwiched between first impurity region 17 and second impurity region 14 are oxidized. More specifically, heat treatment is conducted in which silicon carbide substrate 10 having silicon-containing material 22 formed thereon and exposed at surface 10d of well region 13 is heated to approximately 1300° C., for example, and held for approximately one hour in an oxygen atmosphere. Consequently, gate insulating film 15 formed of a silicon dioxide layer and being in contact with well region 13 and first impurity region 17 of silicon carbide substrate 10 is formed.

Figure 6:
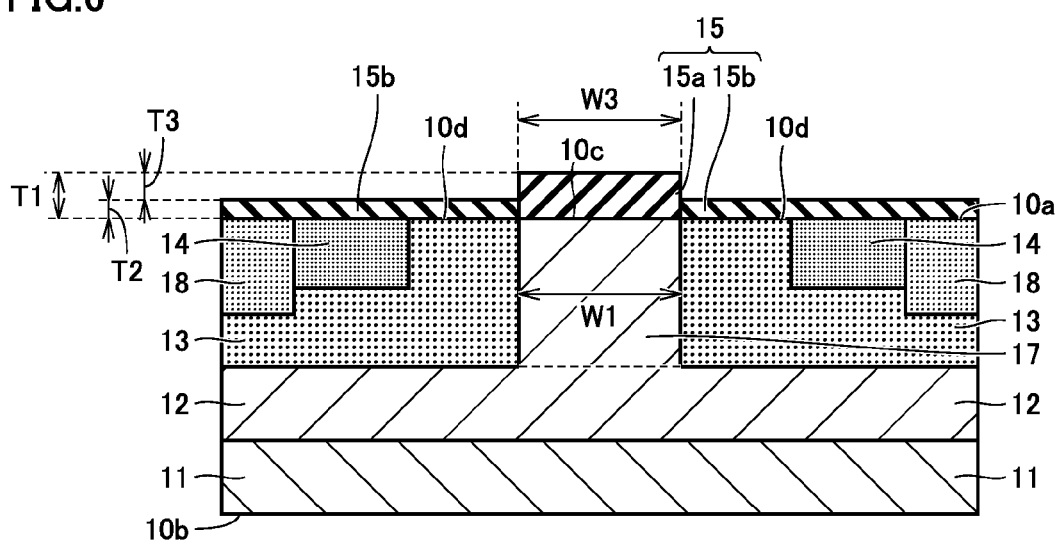
FIG. 6 is a schematic sectional view schematically showing a fourth step of the method of manufacturing the silicon carbide semiconductor device according to the first embodiment of the present invention.
Figure 7:
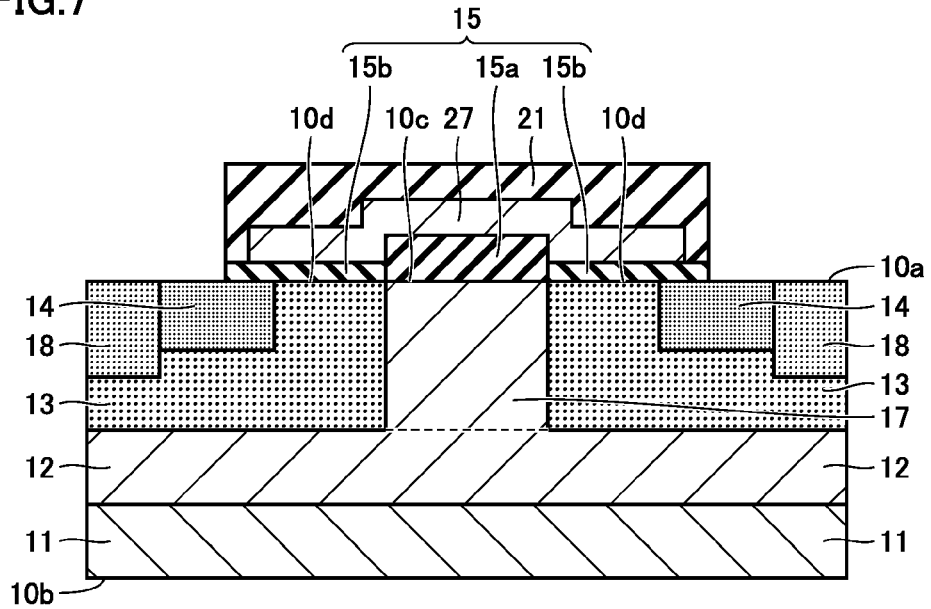
FIG. 7 is a schematic sectional view schematically showing a fifth step of the method of manufacturing the silicon carbide semiconductor device according to the first embodiment of the present invention.

Referring to FIG. 6, gate insulating film 15 formed of a silicon dioxide layer includes first silicon dioxide region 15a on first impurity region 17, and second silicon dioxide region 15b on well region 13 sandwiched between first impurity region 17 and second impurity region 14. Assuming that the thickness of first silicon dioxide region 15a is first thickness T1 and the thickness of second silicon dioxide region 15b is second thickness T2, first thickness T1 is greater than second thickness T2. For example, first thickness T1 is approximately 180 nm, and second thickness T2 is approximately 50 nm.

Preferably, thickness T1 of first silicon dioxide region 15a is 1.5 times or more and 5 times or less, and more preferably 3 times or more and 5 times or less, thickness T2 of second silicon dioxide region 15b. Preferably, the carbon concentration in first silicon dioxide region 15a is lower than the carbon concentration in second silicon dioxide region 15b.

In this embodiment, in the step of forming the silicon dioxide layer, the step of oxidizing silicon-containing material 22 and the step of oxidizing surface 10d of well region 13 are simultaneously performed. Silicon-containing material 22 is almost completely oxidized to become silicon dioxide, while surface 10d made of silicon carbide of well region 13 is also oxidized to become silicon dioxide. When silicon-containing material 22 has a thickness of approximately 60 nm, for example, the silicon dioxide layer formed by the oxidation of material 22 has a thickness of approximately 180 nm. Preferably, a width W3 of first silicon dioxide region 15a is equal to or smaller than width W1 of first impurity region 17.

When gate insulating film 15 is formed by oxidizing main surface 10a of silicon carbide substrate 10, a region of a certain depth from main surface 10a of silicon carbide substrate 10 is oxidized to become silicon dioxide. Here, the thickness of the silicon dioxide is approximately twice the thickness of the oxidized region of silicon carbide substrate 10.

Then, a nitrogen annealing step is performed. Specifically, silicon carbide substrate 10 is held for approximately one hour, for example, at a temperature of approximately 1100° C. in a nitrogen monoxide atmosphere. Subsequently, heat treatment is conducted in which silicon carbide substrate 10 is heated in an inert gas such as argon or nitrogen. In this heat treatment, silicon carbide substrate 10 is held for approximately one hour at a temperature of not less than 1100° C. and not more than 1500° C.

Next, a gate electrode formation step (S40: FIG. 2) is performed. Specifically, referring to FIG. 7, gate electrode 27 made of polysilicon which is a conductor doped with a high concentration of impurity is formed by a CVD (Chemical Vapor Deposition) method, photolithography and etching, for example. Subsequently, interlayer insulating film 21 made of silicon dioxide which is an insulator is formed so as to surround gate electrode 27 by the CVD method, for example. Then, interlayer insulating film 21 and gate insulating film 15 in a region where source contact electrode 16 is to be formed are removed by photolithography and etching.

Next, an ohmic electrode formation step (S50: FIG. 2) is performed. Specifically, a metal film is formed by vapor deposition, for example, so as to be in contact with second impurity region 14 and p+ region 18 on main surface 10a of silicon carbide substrate 10. The metal film is made of Ni (nickel), for example. The metal film may include Ti (titanium) atoms and Al (aluminum) atoms, for example. The metal film may include Ni atoms and Si (silicon) atoms, for example. Once formed, the metal film is heated at approximately 1000° C., for example, to heat and silicidize the nickel film to thereby form source contact electrode 16 in ohmic contact with second impurity region 14 of silicon carbide substrate 10. Similarly, a metal film made of Ni or the like is formed in contact with second main surface 10b of silicon carbide substrate 10, and the metal film is heated to form drain electrode 20.

Next, source wire 19 made of Al which is a conductor is formed by vapor deposition, for example, so as to surround interlayer insulating film 21 and be in contact with source contact electrode 16. In addition, pad electrode 23 made of Al, for example, is formed in contact with drain electrode 20. Following the above procedure completes MOSFET 1 according to this embodiment (see FIG. 1).

While the first conductivity type has been described as n type and the second conductivity type has been described as p type in this embodiment, the present invention is not limited to this embodiment. For example, the first conductivity type may be p type and the second conductivity type may be n type.

While a vertical type MOSFET has been described by way of example as the silicon carbide semiconductor device in this embodiment, the present invention is not limited to this embodiment. For example, the silicon carbide semiconductor device may be a lateral type MOSFET, for example. Alternatively, the MOSFET may be of planar type or trench type. Moreover, the silicon carbide semiconductor device may be an IGBT (Insulated Gate Bipolar Transistor).

A function and effect of MOSFET 1 and the method of manufacturing the same according to this embodiment are now described.

According to MOSFET 1 and the method of manufacturing the same of this embodiment, thickness T1 of first silicon dioxide region 15a is greater than thickness T2 of second silicon dioxide region 15b. Accordingly, the capacitance of MOSFET 1 can be reduced while a decrease in drain current is suppressed. As a result, the switching characteristics of MOSFET 1 can be improved while a decrease in drain current is suppressed.

Moreover, according to the method of manufacturing MOSFET 1 of this embodiment, silicon-containing material 22 includes one of polysilicon, amorphous silicon, and amorphous silicon carbide. Consequently, thickness Ti of first silicon dioxide region 15a can be efficiently made greater than thickness T2 of second silicon dioxide region 15b.

Moreover, according to the method of manufacturing MOSFET 1 of this embodiment, width W2 of silicon-containing material 22 is smaller than width W1 of first impurity region 17. Consequently, even if silicon-containing material 22 expands in a width direction, thickness T1 of first silicon dioxide region 15a can be made greater than thickness T2 of second silicon dioxide region 15b.

Moreover, according to MOSFET 1 and the method of manufacturing the same of this embodiment, the carbon concentration in first silicon dioxide region 15a is lower than the carbon concentration in second silicon dioxide region 15b. Consequently, the insulation performance of first silicon dioxide region 15a can be improved to thereby improve the breakdown voltage at the time of application of a reverse voltage.

Moreover, according to MOSFET 1 and the method of manufacturing the same of this embodiment, first thickness Ti is 1.5 times or more and 5 times or less second thickness T2. When first thickness T1 is 1.5 times or more second thickness T2, the carbon concentration in first silicon dioxide region 15a can be efficiently made lower than the carbon concentration in second silicon dioxide region 15b. When first thickness T1 is 5 times or less second thickness T2, on the other hand, a level difference between gate electrode 27 formed on second silicon dioxide region 15b and gate electrode 27 formed on first silicon dioxide region 15a does not become too great, thus allowing gate electrode 27 to be formed without being isolated.

Furthermore, according to the method of manufacturing MOSFET 1 of this embodiment, in the step of forming the silicon dioxide layer, the step of oxidizing silicon-containing material 22 and the step of oxidizing surface 10d of well region 13 are simultaneously performed. Consequently, first thickness T1 can be efficiently made greater than second thickness T2.

(Second Embodiment)

Figure 8:
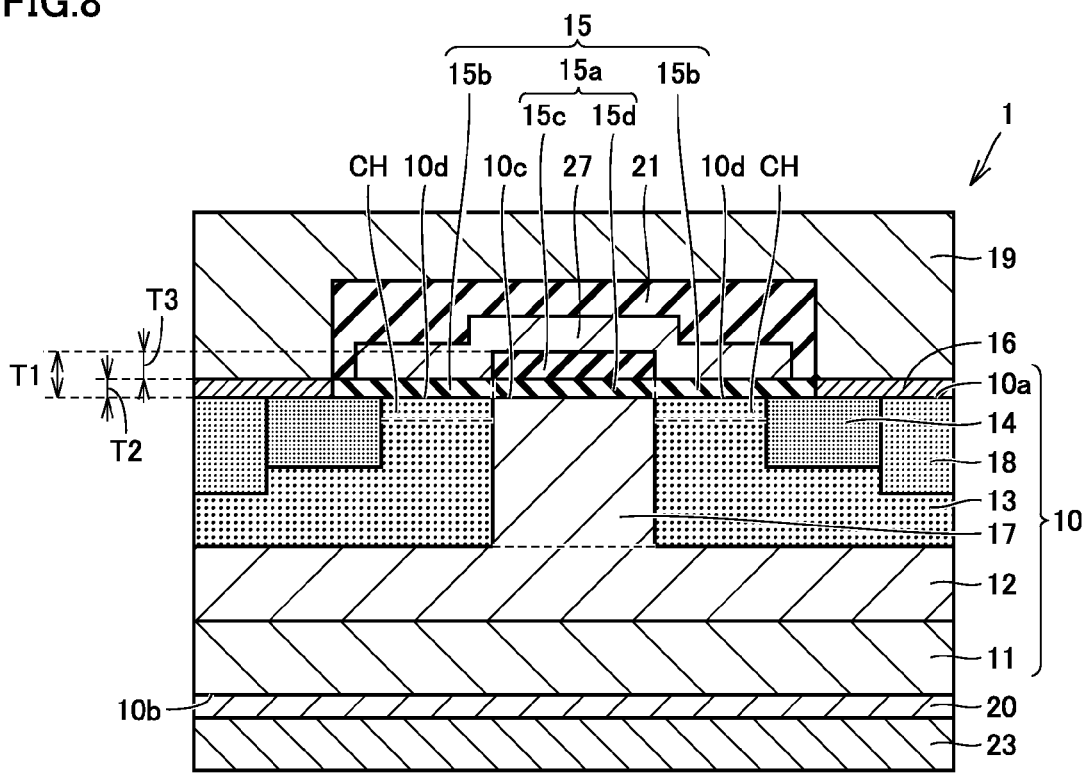
FIG. 8 is a schematic sectional view schematically showing the structure of a silicon carbide semiconductor device according to a second embodiment of the present invention.

Referring to FIG. 8, the configuration of MOSFET 1 which is a silicon carbide semiconductor device in a second embodiment is described. MOSFET 1 according to the second embodiment is similar in configuration to MOSFET 1 according to the first embodiment except that silicon-containing material 22 is formed after second silicon dioxide region 15b has been formed.

In MOSFET 1 according to the second embodiment, gate insulating film 15 includes first silicon dioxide region 15a and second silicon dioxide region 15b. First silicon dioxide region 15a includes a third silicon dioxide region 15c and a fourth silicon dioxide region 15d. As will be described later, fourth silicon dioxide region 15d is a silicon dioxide region formed by oxidizing surface 10c of first impurity region 17 made of silicon carbide. On the other hand, third silicon dioxide region 15c is a silicon dioxide region formed by oxidizing the silicon-containing material.

A carbon concentration in silicon-containing material 22 is lower than a carbon concentration in silicon carbide. Thus, a carbon concentration in third silicon dioxide region 15c is lower than a carbon concentration in fourth silicon dioxide region 15d. As a result, an average value of carbon concentration in first silicon dioxide region 15a including third silicon dioxide region 15c and fourth silicon dioxide region 15d is lower than the carbon concentration in second silicon dioxide region 15b.

An example of a method of manufacturing MOSFET 1 in this embodiment is now described with reference to FIGS. 9 to 12.

Figure 9:
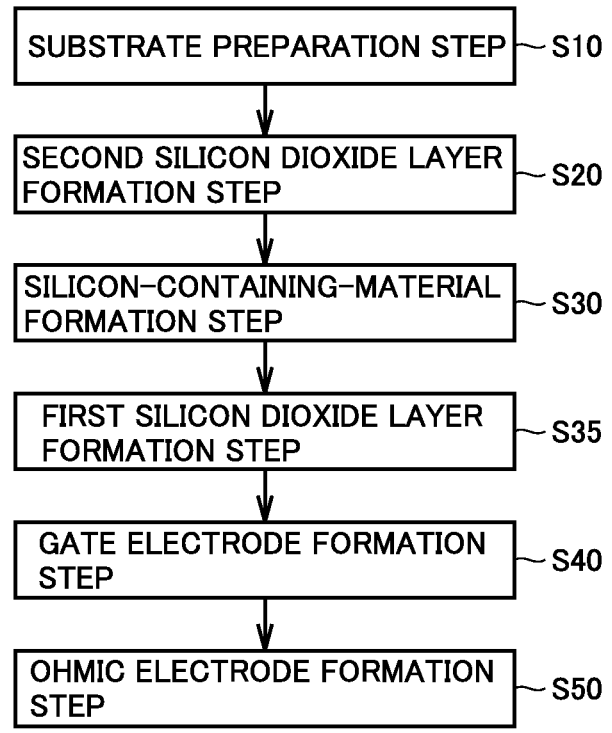
FIG. 9 is a flow diagram schematically showing a method of manufacturing the silicon carbide semiconductor device according to the second embodiment of the present invention.
Figure 10:
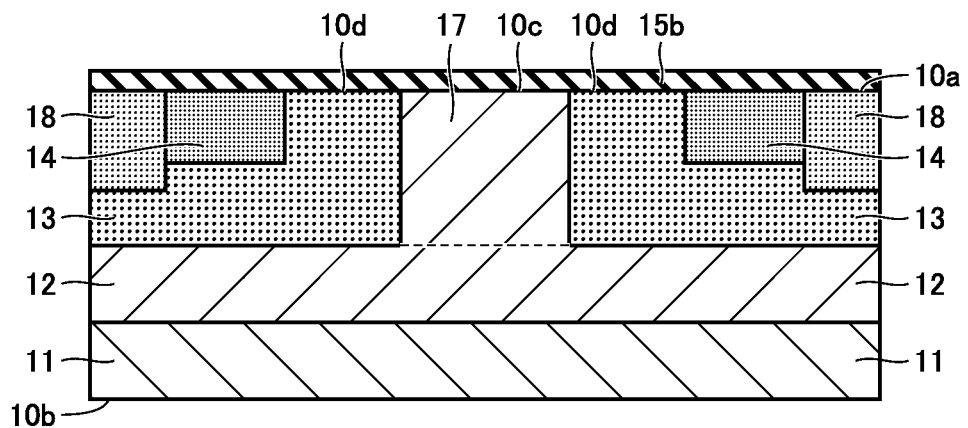
FIG. 10 is a schematic sectional view schematically showing a first step of the method of manufacturing the silicon carbide semiconductor device according to the second embodiment of the present invention.
Figure 11:
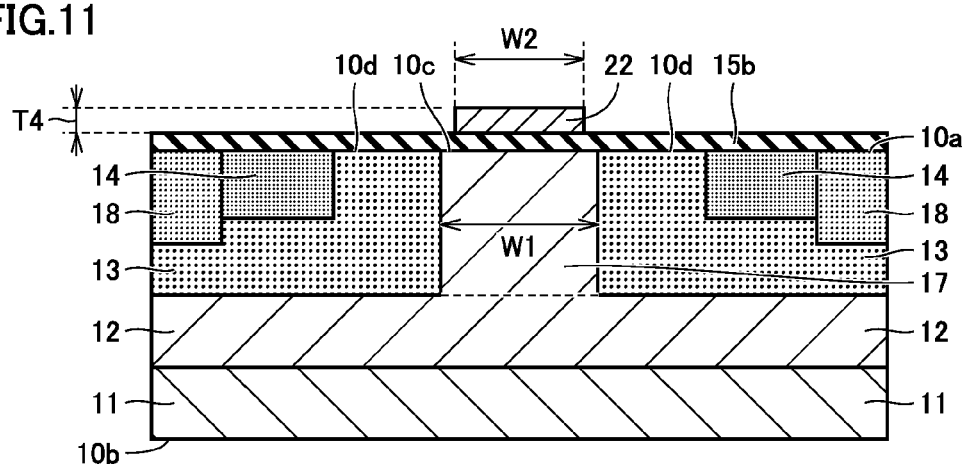
FIG. 11 is a schematic sectional view schematically showing a second step of the method of manufacturing the silicon carbide semiconductor device according to the second embodiment of the present invention.
Figure 12:
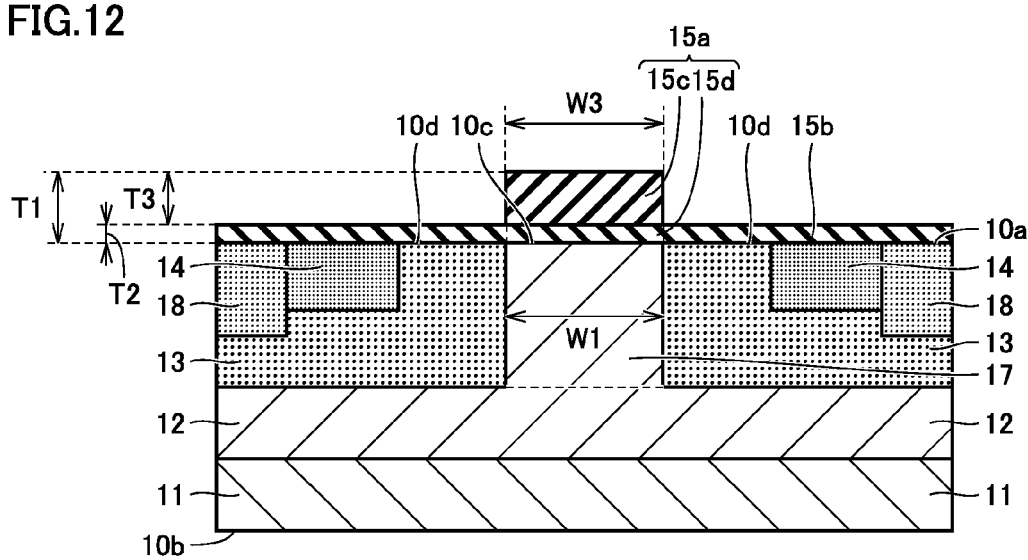
FIG. 12 is a schematic sectional view schematically showing a third step of the method of manufacturing the silicon carbide semiconductor device according to the second embodiment of the present invention.

First, a substrate preparation step (S10: FIG. 9) is performed. Specifically, referring to FIGS. 3 and 4, silicon carbide substrate 10 including first impurity region 17 having n type conductivity, well region 13 being in contact with first impurity region 17 and having p type conductivity different from the n type conductivity, and second impurity region 14 separated from first impurity region 17 by well region 13 and having n type conductivity is prepared with a method similar to the method described in the first embodiment.

Next, a second silicon dioxide region step (S20: FIG. 9) is performed. Specifically, referring to FIG. 10, surface 10c of first impurity region 17 and surface 10d of well region 13 are oxidized. More specifically, silicon carbide substrate 10 exposed at first impurity region 17, well region 13, second impurity region 14 and p+ region 18 is heated for approximately one hour at a temperature of approximately 1300° C., for example, in an oxygen atmosphere, to form second silicon dioxide region 15b in contact with first impurity region 17, well region 13, second impurity region 14 and p+ region 18. Second silicon dioxide region 15b has a thickness of approximately 50 nm, for example.

Next, a silicon-containing material formation step (S30: FIG. 9) is performed. Specifically, referring to FIG. 11, silicon-containing material 22 is formed on first impurity region 17 sandwiched between the pair of well regions 13, with second silicon dioxide region 15b interposed therebetween. The material and thickness of silicon-containing material 22 are similar to the material and thickness described in the first embodiment.

In the step of forming the silicon-containing material, silicon-containing material 22 is preferably formed so as to remain only on first impurity region 17, by depositing polysilicon on second silicon dioxide region 15b formed on main surface 10a of silicon carbide substrate 10 and then patterning it by wet etching or dry etching, for example. Preferably, width W2 of the silicon-containing material formed on surface 10c of first impurity region 17 (the distance in a direction parallel to surface 10c) is smaller than width W1 of the first impurity region (namely, the shortest distance between the pair of well regions 13). Thickness T4 of silicon-containing material 22 is approximately 60 nm, for example.

Next, a first silicon dioxide region formation step (S35: FIG. 9) is performed. Specifically, referring to FIG. 12, for example, silicon-containing material 22 formed on first impurity region 17 of silicon carbide substrate 10 is oxidized. More specifically, heat treatment is conducted in which silicon carbide substrate 10 having silicon-containing material 22 formed thereon is heated to not less than approximately 800° C. and not more than approximately 1200° C., for example, and held for approximately one hour in an oxygen atmosphere. Consequently, third silicon dioxide region 15c is formed on first impurity region 17 of silicon carbide substrate 10 with second silicon dioxide region 15b interposed therebetween. A thickness T3 of third silicon dioxide region 15c is approximately 180 nm, for example.

As described above, gate insulating film 15 including first silicon dioxide region 15a arranged on surface 10c of first impurity region 17, and second silicon dioxide region 15b arranged on surface 10d of well region 13 sandwiched between first impurity region 17 and second impurity region 14 is formed. First silicon dioxide region 15a includes third silicon dioxide region 15c and fourth silicon dioxide region 15d.

Assuming that the thickness of first silicon dioxide region 15a is first thickness T1 and the thickness of second silicon dioxide region 15b is second thickness T2, first thickness T1 is greater than second thickness T2. Preferably, thickness T1 of first silicon dioxide region 15a is 1.5 times or more and 5 times or less, and more preferably 3 times or more and 5 times or less, thickness T2 of second silicon dioxide region 15b. The carbon concentration in first silicon dioxide region 15a is lower than the carbon concentration in second silicon dioxide region 15b.

Width W3 of third silicon dioxide region 15c may be greater than width W2 of the silicon-containing material. Preferably, width W3 of third silicon dioxide region 15c is equal to or smaller than width W1 of first impurity region 17.

Next, a nitrogen annealing step, a gate electrode formation step (S40: FIG. 9) and an ohmic electrode formation step (S50: FIG. 9) are performed with a method similar to the method described in the first embodiment. Then, source wire 19 is formed so as to surround interlayer insulating film 21 and be in contact with source contact electrode 16. In addition, pad electrode 23 made of Al, for example, is formed in contact with drain electrode 20. Following the above procedure completes MOSFET 1 according to this embodiment (see FIG. 8).

It is noted that the conditions and the like in the steps that have not been described in the method of manufacturing MOSFET 1 in the second embodiment are similar to those in the method of manufacturing MOSFET 1 in the first embodiment.

A function and effect of MOSFET 1 and the method of manufacturing the same according to this embodiment are now described.

According to the method of manufacturing MOSFET 1 of this embodiment, in the step of forming the silicon dioxide layer, the step of forming silicon-containing material 22 is performed after the step of oxidizing surface 10d of well region 13. Consequently, an oxidation temperature for surface 10d of well region 13 and an oxidation temperature for silicon-containing material 22 can be independently adjusted.

Moreover, according to the method of manufacturing MOSFET 1 of this embodiment, the temperature in the step of oxidizing silicon-containing material 22 is lower than the temperature in the step of oxidizing surface 10d of well region 13. Consequently, silicon-containing material 22 can be oxidized without being melted.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 MOSFET; 10 silicon carbide substrate; 10a main surface; 10b second main surface; 10c, 10d surface; 11 base substrate; 12 drift layer; 13 well region; 14 second impurity region; 15 gate insulating film (silicon dioxide layer); 15a first silicon dioxide region; 15b second silicon dioxide region; 15c third silicon dioxide region; 15d fourth silicon dioxide region; 16 source contact electrode; 17 first impurity region (JFET region); 18 p+ region; 19 source wire; 20 drain electrode; 21 interlayer insulating film; 22 silicon-containing material; 23 pad electrode; 27 gate electrode; CH channel region; T1 first thickness; T2 second thickness; W1, W2, W3 width.

The invention claimed is:

1. A method of manufacturing a silicon carbide semiconductor device, comprising the steps of:
preparing a silicon carbide substrate, said silicon carbide substrate including a first impurity region having a first conductivity type, a well region being in contact with said first impurity region and having a second conductivity type different from said first conductivity type, and a second impurity region separated from said first impurity region by said well region and having said first conductivity type;
forming a silicon dioxide layer in contact with said first impurity region and said well region; and
forming a gate electrode on said silicon dioxide layer,
said step of forming a silicon dioxide layer including the steps of
forming a silicon-containing-material on said first impurity region,
oxidizing said silicon-containing-material, and
oxidizing a surface of said well region sandwiched between said first impurity region and said second impurity region,
said silicon dioxide layer including a first silicon dioxide region on said first impurity region, and a second silicon dioxide region on said well region sandwiched between said first impurity region and said second impurity region,
assuming that the thickness of said first silicon dioxide region is a first thickness and the thickness of said second silicon dioxide region is a second thickness, said first thickness being greater than said second thickness,
wherein said silicon-containing-material includes one of polysilicon, amorphous silicon, and amorphous silicon carbide.

2. The method of manufacturing a silicon carbide semiconductor device according to claim 1, wherein
the width of said silicon-containing-material is smaller than the width of said first impurity region.

3. The method of manufacturing a silicon carbide semiconductor device according to claim 1, wherein
a carbon concentration in said first silicon dioxide region is lower than a carbon concentration in said second silicon dioxide region.

4. The method of manufacturing a silicon carbide semiconductor device according to claim 1, wherein
said first thickness is 1.5 times or more and 5 times or less said second thickness.

5. The method of manufacturing a silicon carbide semiconductor device according to claim 1, wherein
in said step of forming a silicon dioxide layer, said step of oxidizing said silicon-containing-material and said step of oxidizing a surface of said well region are simultaneously performed.

6. The method of manufacturing a silicon carbide semiconductor device according to claim 1, wherein
in said step of forming a silicon dioxide layer, said step of forming a silicon-containing-material is performed after said step of oxidizing a surface of said well region.

7. The method of manufacturing a silicon carbide semiconductor device according to claim 6, wherein
a temperature in said step of oxidizing said silicon-containing-material is lower than a temperature in said step of oxidizing a surface of said well region.

* * * * *